(12) United States Patent
Voorma et al.

(10) Patent No.: US 7,145,640 B2
(45) Date of Patent: Dec. 5, 2006

(54) LITHOGRAPHIC APPARATUS, DEVICE MANUFACTURING METHOD AND VARIABLE ATTENUATOR

(75) Inventors: Harm-Jan Voorma, Zaltbommel (NL); Antonius Johannes Josephus Van Dijsseldonk, Hapert (NL); Uwe Mickan, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 150 days.

(21) Appl. No.: 10/805,526

(22) Filed: Mar. 22, 2004

(65) Prior Publication Data

US 2005/0206869 A1    Sep. 22, 2005

(51) Int. Cl.
G03B 27/72 (2006.01)
G03B 27/42 (2006.01)
G03B 27/54 (2006.01)

(52) U.S. Cl. ............................ 355/69; 366/53; 366/67
(58) Field of Classification Search .................. 355/53, 355/67–71, 77; 385/140; 250/505.1; 333/81 R
See application file for complete search history.

(56) References Cited

U.S. PATENT DOCUMENTS

| 4,192,573 | A | * | 3/1980 | Brown, Jr. | 359/365 |
|---|---|---|---|---|---|
| 4,778,263 | A | * | 10/1988 | Foltyn | 359/580 |
| 6,359,969 | B1 | | 3/2002 | Shmaenok | |
| 6,577,379 | B1 | * | 6/2003 | Boettiger et al. | 355/52 |
| 6,587,182 | B1 | * | 7/2003 | Goto | 355/71 |
| 6,859,259 | B1 | * | 2/2005 | Bakker et al. | 355/53 |
| 2002/0027644 | A1 | * | 3/2002 | Bisschops | 355/30 |
| 2003/0063266 | A1 | | 4/2003 | Leenders | |
| 2005/0190354 | A1 | * | 9/2005 | de Jager | 355/67 |

FOREIGN PATENT DOCUMENTS

| EP | 1 233 468 A2 | 8/2002 |
|---|---|---|
| JP | 5251310 | 9/1993 |

OTHER PUBLICATIONS

Van Loevezijn et al., "Numerical and experimental study of disordered multilayers for broadband x-ray reflection", Applied Optics, vol. 35 (No. 19), p. 3614-1619, (Jul. 1996).
European Search Report for EP Appln. No. EP 05 10 2250, dated Dec. 6, 2005.

* cited by examiner

Primary Examiner—Henry Hung Nguyen
(74) Attorney, Agent, or Firm—Pillsbury Winthrop Shaw Pittman LLP (57) ABSTRACT

A lithographic apparatus includes an illumination system for providing a projection beam of radiation, a support structure for supporting patterning structure for imparting a pattern to the projection beam, a substrate table for holding a wafer and a projection system for projecting the patterned beam onto a target portion of the wafer. In order to permit control of the radiation dose at the wafer so that the throughput of wafers can be optimised, a variable attenuator is provided to vary the intensity of the projection beam while not changing the position of the beam. The variable attenuator includes two parallel mirrors positioned such that an input beam of radiation is incident on a first of the mirrors by which it is reflected towards a second of the mirrors by which the beam is reflected to produce an output beam of radiation of required intensity for input to the illumination system, and a tilting mechanism for tilting the mirrors such that the mirrors remain parallel to one another and the angles of incidence of the beams on the mirrors are changed so as to vary the intensity of the output beam. This allows the intensity of the projection beam to be varied continuously without changing the position of the beam, whether the input beam is converging, diverging or parallel.

22 Claims, 4 Drawing Sheets

LITHOGRAPHIC APPARATUS, DEVICE MANUFACTURING METHOD AND VARIABLE ATTENUATOR

FIELD OF THE INVENTION

The present invention relates generally to a lithographic apparatus, a device manufacturing method and more particularly to a lithographic apparatus having a variable attenuator.

BACKGROUND TO THE INVENTION

A lithographic apparatus is a machine that applies a desired pattern onto a target portion of a substrate. Lithographic apparatus can be used, for example, in the manufacture of integrated circuits (ICs). In that circumstance, a patterning structure, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

An illumination system is provided for receiving a beam of radiation from a radiation source and for supplying a conditioned beam of radiation, referred to as the projection beam, having a desired uniformity and intensity distribution in its cross-section for patterning by the reticle. The source and the lithographic apparatus may be separate entities, for example when the source is a plasma discharge source. In such cases, the source is not considered to form part of the lithographic apparatus and the radiation beam is generally passed from the source to the illumination system with the aid of a radiation collector comprising, for example, suitable collecting mirrors and/or a spectral purity filter. In other cases the source may be an integral part of the apparatus, for example when the source is a mercury lamp.

The illumination system may comprise components for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illumination system may also include an attenuator for varying the overall intensity of the projection beam in order to control the radiation dose at the wafer, for example to enable the dose at the wafer to be maintained constant while the source intensity drifts during multiple scans, or to change the dose at the wafer during scanning of an image while keeping the scan speed constant. However known attenuators used in such an application tend to adversely affect the operation of the rest of the illumination system, for example by changing the position of the illumination beam, and/or are difficult to control in such a manner as to accurately adjust the dose at the wafer and to control the speed of adjustment of the dose might be an issue, thereby adversely affecting the throughput and yield of wafers.

It is known to provide an attenuator in the form of a blade having three separate regions each of which has a different transmission characteristic, the attenuator being adjustable so as to move one region at a time into the radiation path, so as to allow three different discrete levels of attenuation depending on the position of the blade. However the use of only three different attenuation levels, and a fourth level in which no attenuation is provided corresponding to the blade being moved out of the radiation path, may be insufficient to maintain the required high dose accuracy at the wafer and high wafer throughput based on variation of this dose. Apart from the fact that such attenuators do not provide continuously variable levels of attenuation, they have the disadvantage that cooling may be complicated because of the complexity of the attenuator blades or poor cooling capabilities of gas cells. Furthermore the use of a blade in the beam may adversely affect certain factors determining the performance of the system, such as the uniformity of the projection beam.

SUMMARY OF THE INVENTION

In accordance with one aspect of the present invention there is provided a lithographic apparatus including, an illumination system for providing a projection beam of radiation, a support structure for supporting patterning structure to impart a pattern to the projection beam, a substrate table for holding a substrate, and a projection system for projecting the patterned beam onto a target portion of the substrate, wherein the illumination system includes a variable attenuator comprising two parallel reflective surfaces positioned such that an input beam of radiation is incident on a first of the reflective surfaces by which it is reflected towards a second of the reflective surfaces by which the radiation is reflected to produce an output beam of radiation of required intensity, and tilting means for tilting the reflective surfaces such that the reflective surfaces remain parallel to one another and the angles of incidence of the beams on the reflective surfaces are changed so as to vary the intensity of the output beam without changing the position of the output beam.

The use of such a variable attenuator allows the radiation dose at the wafer to be accurately controlled substantially without adversely affecting other performance parameters, such as the uniformity and or telecentricity of the apparatus, while maintaining a high throughput of wafers. More particularly the attenuator allows the intensity of the projection beam to be varied continuously without changing the position of the beam, whether the input beam is converging, diverging or parallel. Furthermore the attenuator can be controlled in dependence on the output from a dose monitoring sensor positioned to monitor the dose received by the wafer. Additionally the back sides of the mirrors can be cooled in a straightforward manner to offset the heat absorption at high attenuation rates. This may allow most of the heat load to be absorbed in relatively simple, and therefore low cost, optics, thus making the design of the apparatus less complicated and therefore more cost efficient.

In one embodiment, the reflective surfaces have plane reflecting surfaces from which the beams are reflected. However other shapes of the reflecting surfaces of the mirrors, for example surfaces curved in the direction of propagation of the input beam, are within the scope of the invention.

In one embodiment of the invention the reflective surfaces are positioned relative to the input beam such that the radiation is incident on the reflective surfaces at angles of between approximately 25 and 60 degrees. This embodiment may be used for applications in which a relatively high degree of attenuation is required.

In another embodiment of the invention the reflective surfaces are positioned relative to the input beam such that the radiation is incident on the reflective surfaces at angles of grazing incidence of up to 25 degrees. In this embodiment there is less attenuation of the radiation than would be the case with the greater angles of incidence of the previous embodiment, but higher maximum transmission, up to 96% for example, can be obtained.

Furthermore the reflective surfaces may be positioned relative to the input beam such that the radiation is focussed at a point between the reflective surfaces. This is advantageous as it allows the reflective surfaces to be decreased in size as compared with the case in which the focus is not between the two reflective surfaces, particularly when small grazing angles of incidence are used or when the beam has a large cross-section. Alternatively the reflective surfaces may be positioned relative to the input beam such that the radiation is focussed at a point beyond the second reflective surface or at a point before the first reflective surface.

In order to enhance their reflectivity the reflective surfaces may be provided with single layer coatings or possibly with graded multi-layer coatings. In many cases a single layer coating is useful because of the relatively high reflection at small angles of incidence.

In some embodiments, an actuator is arranged to effect shifting of the reflective surfaces in opposite senses at the same time as the reflective surfaces are tilted so as to maintain the output beam in substantially the same position for different attenuation settings. Such shifting may offset any movement of the virtual focus point during adjustment of the attenuator. A number of different mechanisms can be used to effect tilting and shifting of the reflective surfaces in unison.

In another embodiment the illumination system is arranged to receive radiation from a source of radiation, and an actuator is provided for shifting the position of the source as the reflective surfaces are tilted so as to maintain a virtual focus point at which the beam is focussed in substantially the same position for different attenuation settings.

The arrangement described above may find particular benefit when the radiation in the projection beam has a wavelength in the EUV range, that is between about 5 and about 20 nm, although it will be appreciated that the invention may be used in conjunction with radiation of any wavelength.

In accordance with a further aspect of the invention there is provided a device manufacturing method including, providing a substrate, providing a projection beam of radiation using an illumination system, using patterning structure to impart a pattern to the projection beam, passing the patterned beam of radiation through a projection system so as to project it onto a target portion of the substrate, and, varying the intensity of the projection beam of radiation supplied by the illumination system by positioning two parallel reflective surfaces such that an input beam of radiation is incident on a first of the reflective surfaces by which it is reflected towards a second of the reflective surfaces by which the radiation is reflected to produce an output beam of radiation of required intensity, and by tilting the reflective surfaces such that the reflective surfaces remain parallel to one another and the angles of incidence of the radiation on the reflective surfaces are changed so as to vary the intensity of the output beam without changing the position of the output beam.

The invention also provides a variable attenuator comprising two parallel reflective surfaces positioned such that an input beam of radiation is incident on a first of the reflective surfaces by which it is reflected towards a second of the reflective surfaces by which the radiation is reflected to produce an output beam of radiation of required intensity, and an actuator constructed and arranged to tilt the reflective surfaces such that the reflective surfaces remain parallel to one another and the angles of incidence of the beams on the reflective surfaces are changed so as to vary the intensity of the output beam without changing the position of the output beam.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning means" or "patterning structure" used herein should be broadly interpreted as referring to devices that can be used to impart to a projection beam a pattern over its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning structure. It holds the patterning structure in a way depending on the orientation of the patterning structure, the design of the lithographic apparatus, and other conditions, such as for example whether or not the patterning structure is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings, in which like reference symbols indicate corresponding parts, and in which.

DETAILED DESCRIPTION OF THE PREFERRED EMBODIMENTS

While the following description refers to specific embodiments of the invention, it will be appreciated that the invention may be practiced otherwise than as described below. The description is not intended to limit the invention.

Figure 1:
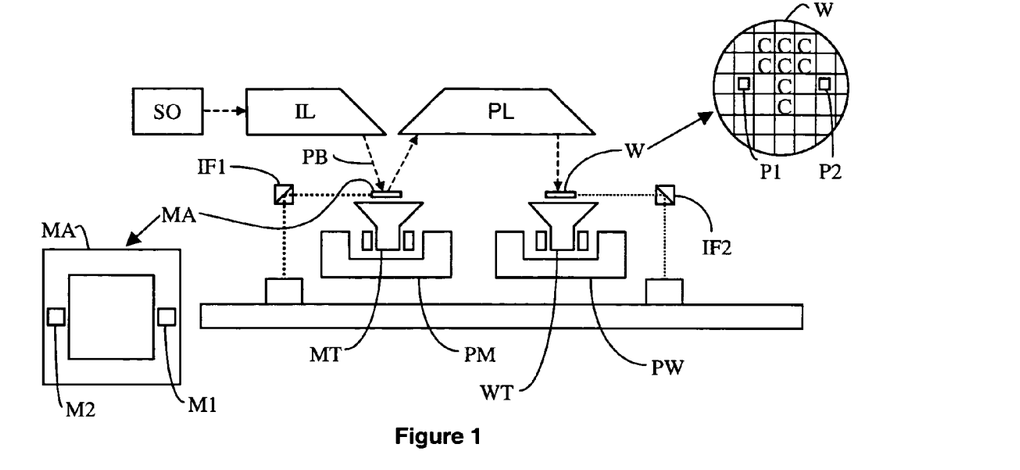
FIG. 1 diagrammatically shows a typical lithographic apparatus.

FIG. 1 schematically depicts a typical lithographic apparatus. The apparatus comprises:

an illumination system IL for providing a projection beam PB of radiation (e.g. UV or EUV radiation).

a first support structure (e.g. a mask table) MT for supporting patterning structure (e.g. a mask) MA and connected to first positioning means PM for accurately positioning the patterning structure with respect to item PL;

a substrate table (e.g. a wafer table) WT for holding a substrate (e.g. a resist-coated wafer) W and connected to second positioning means PW for accurately positioning the substrate with respect to item PL; and a projection system (e.g. a reflective projection lens) PL for imaging a pattern imparted to the projection beam PB by patterning structure MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illumination system IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illumination system IL with the aid of a radiation collector comprising for example suitable collecting mirrors and/or a spectral purity filter. In other cases the source may be integral part of the apparatus, for example when the source is a mercury lamp. The source SO and the illumination system IL may be referred to as a radiation system.

The illumination system IL may comprise elements for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illumination system provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning means PW and position sensor IF2 (e.g. an interferometric device), the substrate table WT can be moved accurately, e.g. so as to position different target portions C in the path of the beam PB. Similarly, the first positioning means PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 2:
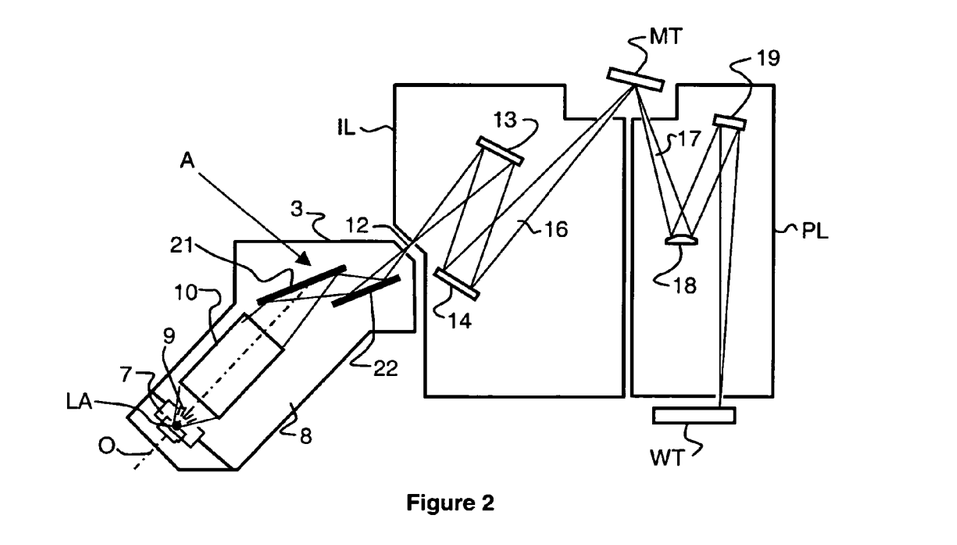
FIGS. 2 and 3 diagrammatically shows two embodiments of the invention for use with extreme ultra-violet (EUV) radiation.

FIG. 2 shows a side view of EUV lithographic apparatus in accordance with an embodiment of the invention. It should be noted that, although the arrangement is different to that of the apparatus shown in FIG. 1, the principle of operation is similar. The apparatus comprises a source-collector module or radiation unit 3, an illumination system IL, and a projection system PL. The radiation unit 3 is provided with a radiation source LA that may employ a gas or vapor, such as for example Xe gas or Li vapor in which a very hot discharge plasma is created so as to emit radiation in the EUV range of the electromagnetic radiation spectrum. The discharge plasma is created by causing a partially ionised plasma of an electrical discharge to collapse onto the optical axis O. Partial pressures of 0.1 mbar of Xe, Li vapor or any other suitable gas or vapor may be required for efficient generation of the radiation. The radiation emitted by radiation source LA is passed from the source chamber 7 into collector chamber 8 by way of a gas barrier structure or "foil trap" 9. The gas barrier structure comprises a channel structure such as, for instance, described in detail in EP-A-1 233 468 and EP-A-1 057 079, which are incorporated herein by reference.

The collector chamber 8 incorporates a radiation collector 10 that is formed, for example, by a grazing incidence collector. Radiation passed by the collector 10 is reflected by two parallel mirrors 21 and 22 of a variable attenuator A to be focused at a virtual source point 12 at an aperture in the collector chamber 8. From the collector chamber 8, the projection beam 16 is reflected by normal incidence reflectors 13, 14 within the illumination system IL onto the reticle or mask positioned on the mask table MT. A patterned beam 17 is formed which is imaged onto the substrate table WT by reflective elements 18, 19 of the projection system PL. More elements than shown may be present in the illumination system IL and projection system PL.

Figure 3:
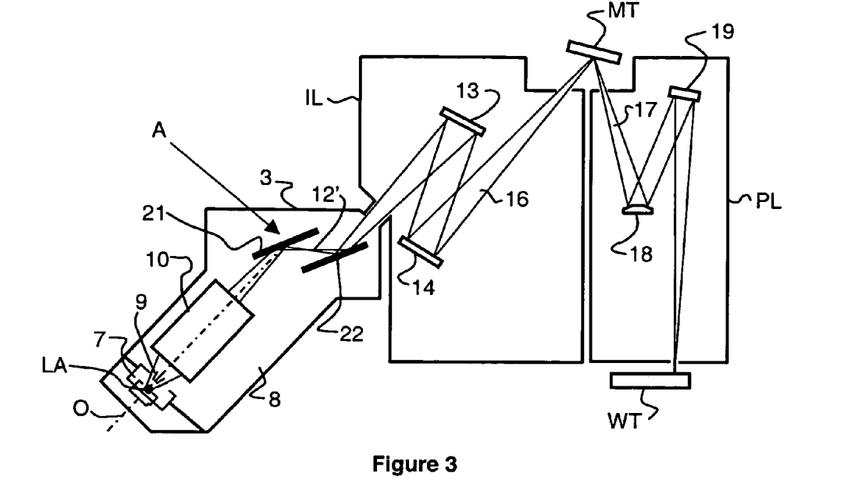

When the beam of radiation input into the variable attenuator A is divergent, the mirrors 21 and 22 of the attenuator A may serve to focus the radiation at the virtual source point 12 beyond the second mirror 22. In a non-illustrated embodiment the beam of radiation is focussed at a point before both of the mirrors. Furthermore FIG. 3 shows an alternative embodiment in which the divergence of the input beam of radiation is such that the beam is focussed at a point 12' between the mirrors 21 and 22 which is advantageous as it enables smaller reflective surfaces of the mirrors to be used, and thus simplifies the production of the mirrors and renders them less costly.

Figures 4A, 4B:
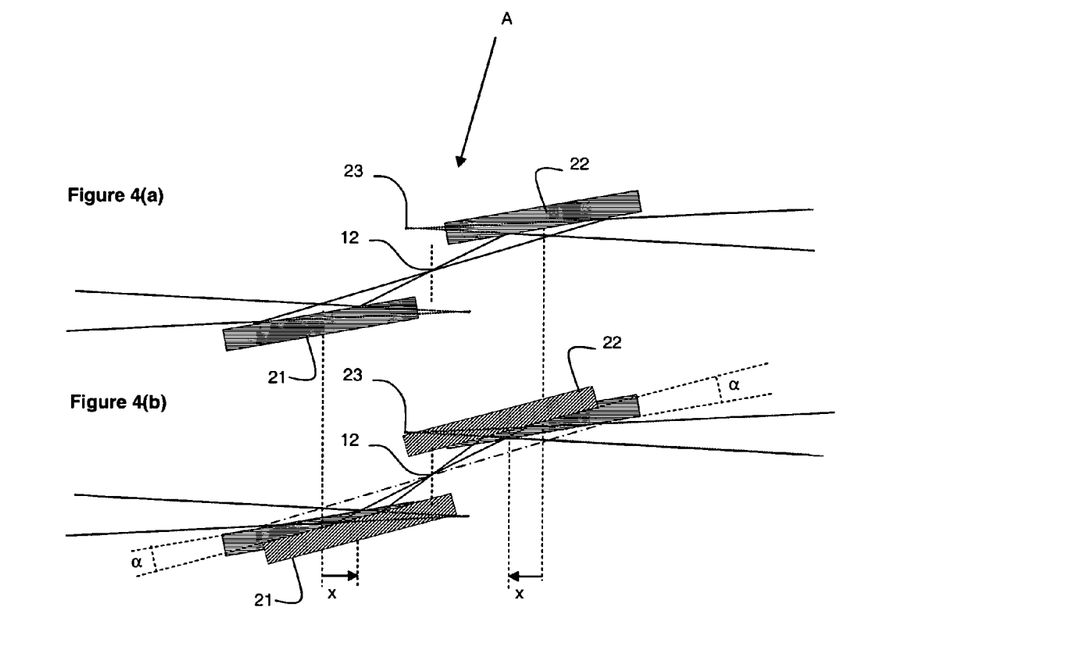
FIGS. 4(a) and 4(b) and 5(a) and 5(b) are explanatory diagrams.

The degree of attenuation of the beam by the attenuator A can be varied in a manner which will now be described in more detail with reference to the explanatory diagram of FIGS. 4(a) and 4(b), showing the attenuator A in a first attenuating position at 4(a) and, after adjustment of the attenuator A, in a second attenuating position at 4(b). The beam is attenuated to a greater extent by the attenuator A in the second attenuating position 4(b) than in the first attenuating position 4(a), by virtue of the fact that the beam is incident on the reflecting surfaces of the mirrors 21 and 22 at greater angles so that a lesser proportion of the radiation is reflected by the mirrors (and a greater proportion is absorbed by the mirrors and dissipated as heat). There is also shown in broken lines at 4(b) the positions of the mirrors 21 and 22 prior to such adjustment, so that the degree of movement of the mirrors between the two positions can be clearly appreciated. In this regard it will be seen that each of the mirrors 21 and 22 has been rotated in a counter clockwise direction through an angle $\alpha$, and at the same time each of the mirrors 21 and 22 has been shifted by a distance x with the mirrors being shifted in different senses relative to the direction of propagation of the output beam. In both adjustment positions 4(a) and 4(b) the beam is focussed at the same point 12 between the mirrors 21 and 22, and the output beam is transmitted along substantially the same path. Thus the degree of attenuation of the attenuator A can be adjusted without adversely affecting the other properties of the illumination system. Also shown at 4(b) in the figure is the virtual focus point 23 which is the apparent point at which the beam is focussed as seen by the illumination system. The distance between the virtual focus point 23 and the next mirror 13 of the illumination system should be constant for all attenuator settings (that is different tilt angles $\alpha$ and position shifts x).

The above described focussing of the beam relies on the input beam being divergent (or convergent). In the case where the beam is a parallel beam the focus point 12 and the virtual focus point 23 will not exist.

Figures 5A, 5B:
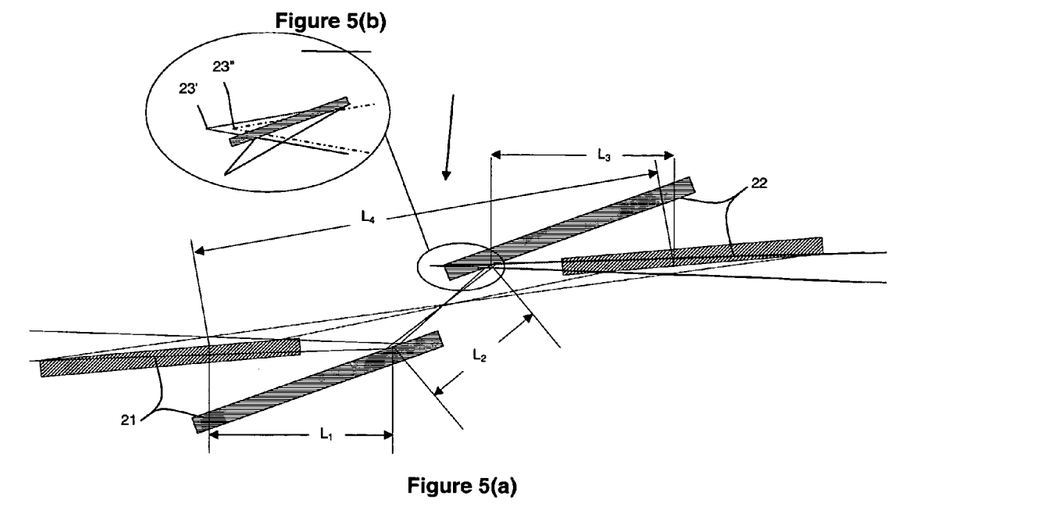

It is possible to compensate for changes in the position of the virtual focus point 23 as a result of adjustment of the attenuator A by tilting and shifting of the mirrors 21 and 22 to vary the attenuation. FIGS. 5(a) and 5(b) are explanatory diagrams showing two adjustment settings of the mirrors 21 and 22, with the adjustments exaggerated so as to emphasise the path length difference of the beam passing through the attenuator between the two adjustment positions. It can be seen from the figures that there is a path length difference between the two attenuation settings in that $L_4 < L_1 + L_2 + L_3$. As a result, where the input beam is non-parallel, the virtual focus point will shift between the positions 23' and 23" as shown in the enlargement 5(b) of a detail of 5(a). In order to ensure that the two virtual focus points 23' and 23" corresponding to the two attenuation settings coincide in position, it is possible for a compensating arrangement to be provided for ensuring that these points are maintained in substantially constant positions by shifting of the source LA along the optical axis O as shown in FIGS. 1 and 2. The shifting of the source in such an arrangement could be performed by moving the cathode and anode of a discharge source. Such an arrangement ensures that the virtual focus points 23' and 23" coincide while shifting the actual focus point 12, as between the two adjustment positions. If the source LA is shifted along the optical axis OA by a distance $\Delta v$, this will cause a $M^2 \times \Delta v$ shift of the focus point 12, where M is the magnification of the radiation collector 10, and shifting of the focus point 12 along the light path will result in an equal shift of the virtual focus point. This can be explained using the simple ideal lens formula:

$$\frac{1}{v} + \frac{1}{b} = \frac{1}{f}$$

where:

v is the object distance (that is the source position)

b is the image distance (that is the position of the focus point 12)

f is the focal distance of the collector module (10 in FIG. 3)

When a small shift ($\Delta b$) is needed a small shift of the source ($\Delta v$) can be applied, this resulting in the following equation:

$$\frac{1}{(v + \Delta v)} + \frac{1}{(b + \Delta b)} = \frac{1}{f}$$

which can be simplified assuming that $$(v + \Delta v - f) \approx (v - f)$$

(which is true for a small shift $\Delta v$)

$$\Delta b = -\left(\frac{b}{v}\right)^2 \Delta v \Rightarrow \Delta b = -M^2 \Delta v$$

where M is the magnification of the collector module

Figure 6:
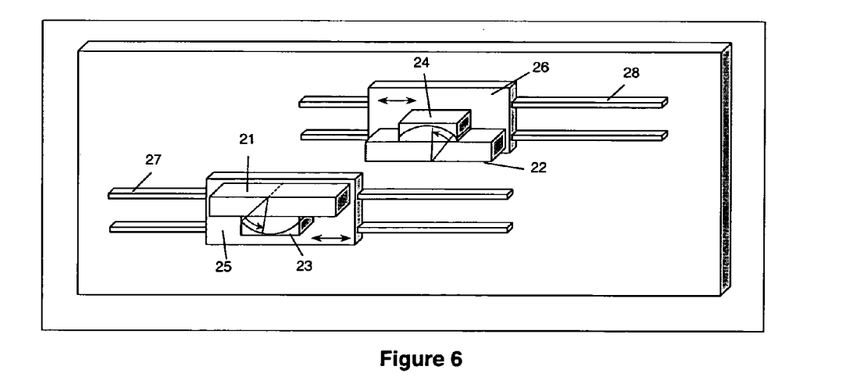
FIG. 6 shows a mirror adjustment mechanism that may be used in an embodiment of the invention.

FIG. 6 shows a possible arrangement for tilting and shifting of the mirrors 21 and 22 in such an attenuator. To this end the mirrors 21 and 22 are mounted on sliders 25 and 26 by tilting bearings 23 and 24. The mirrors 21 and 22 are tiltable in the bearings 23 and 24 on the sliders 25 and 26 so as to adjust the angles of the mirrors 21 and 22 relative to the input beam, while at the same time the mirrors 21 and 22 are shiftable in opposite directions by sliding of the sliders 25 and 26 along rails 27 and 28 on which the sliders 25 and 26 are mounted. Movement of the sliders 25 and 26 may be effected by linear motors, and tilting of the mirrors 21 and 22 may be effected by motorised tilt tables.

It will be appreciated that the attenuation properties of the attenuator depend not only on the angles of incidence of the beam with the reflecting surfaces of the mirrors, but also on the reflectivity of the reflecting surfaces, and that this reflectivity can be enhanced by the provision of special coatings on the reflecting surfaces as already mentioned above.

Figure 7:
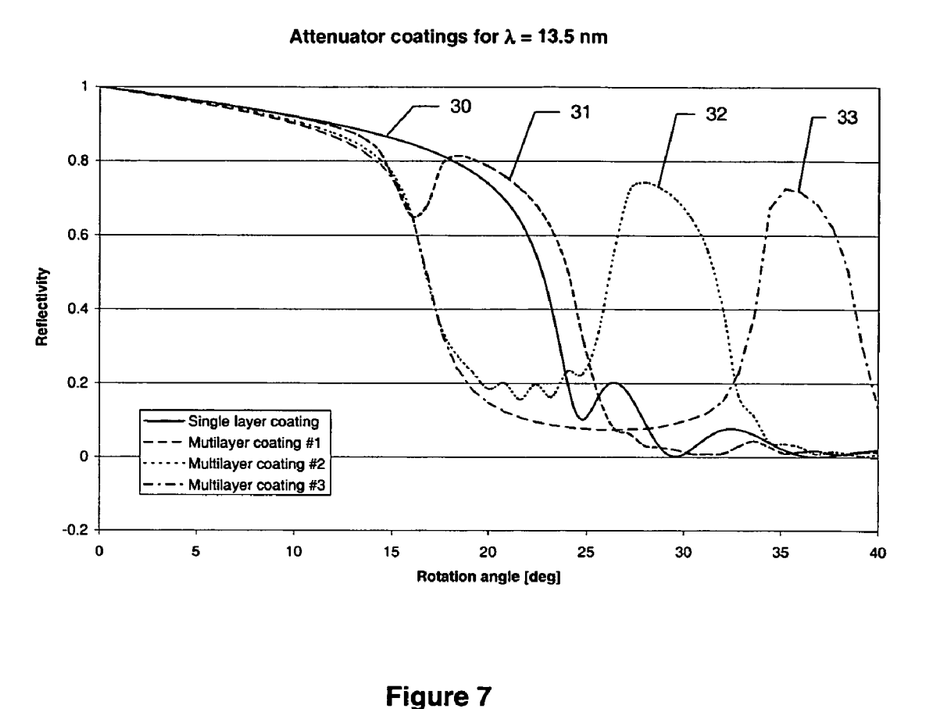
FIG. 7 is a graph of reflectivity as a function of angle for different coatings.

FIG. 7 is a graph of the reflectivity of each reflecting surface as a function of the chief ray angle of the beam with respect to the mirror surface of the attenuator A for radiation of wavelength 13.5 nm. Four curves are shown on this graph corresponding to four different coatings, namely (i) a curve 30 (shown as a solid line) corresponding to a single layer coating, (ii) a curve 31 (shown as a broken line) corresponding to a first multilayer coating, (iii) a curve 32 (shown as a dotted line) corresponding to a second multilayer coating, and (iv) a curve 33 (shown as a dot-dash line) corresponding to a third multilayer coating. Different coatings can be applied to the reflecting surfaces depending on the optical layout of the illumination system, and thus the required radiation intensity profile of the attenuator output beam. In most cases the single layer coating is preferred because of its high reflectivity (up to 96%) at small angles (of the order of 5 degrees) resulting in 92% overall transmission for the whole attenuator. At an angle of 25 degrees each of the mirrors has a typical reflectivity of 10% so the whole attenuator has an overall transmission of 1% (10%×10%), which means that the total transmission range of such an attenuator extends from 92% (at 5 degrees) to 1% (at 25 degrees).

It will be appreciated that a wide range of different coatings may be used, including graded multilayer coatings and randomised multilayer coatings as described in Applied Optics, Vol. 35, No. 19, July 1996 by P. van Loevenstein, et al). A normal multilayer coating is generally considered as a repeating structure with equal thicknesses for each bilayer. However graded multilayers may comprise bilayers at the top of the coating have an increased thickness as compared with the thicknesses of the bilayers at the bottom of the coating, or vice versa. It is also possible to use randomised multilayers in which the bilayer thickness changes randomly over the thickness of the stack of bilayers. In such a randomized multilayer the bilayer thickness may vary between 12 nm and 30 nm.

In the case of the examples for which the curves of FIG. 7 have been produced, the single layer coating corresponding to the curve 30 is a 40 nm Molybdenum (Mo) coating. The first multilayer coating corresponding to the curve 31 is a 30 nm Molybdenum/Silicon (Mo/Si) multilayer coating comprising a 12 nm Mo layer on top of a 18 nm Si layer on top of a 12 nm Mo layer. The second and third multilayer coatings corresponding to the curves 32 and 33 are also Mo/Si multilayer coatings having bilayer thicknesses of 17 nm (for 32) and 13 nm (for 33). The bilayer thickness is the thickness of one Mo and one Si layer together. For the multilayer coatings producing the curves 32 and 33 the number of bilayers is respectively 10 and 40.

A number of variants of the above described embodiments can be contemplated within the scope of the invention. For example, the lithographic apparatus described includes a reflective reticle and a projection system including reflective elements, but a transmissive reticle and/or elements in the projection system may also be used. Furthermore, the apparatus has been described for use with EUV radiation but it will be appreciated that radiation of other wavelengths may also be used.

The invention claimed is:

1. A lithographic apparatus comprising:
   an illumination system configured to provide a projection beam of radiation;
   a support structure configured to support patterning structure, said patterning structure constructed and arranged to impart a pattern to the projection beam;
   a substrate table configured to hold a substrate; and
   a projection system configured to project the patterned beam onto a target portion of the substrate;
   a variable attenuator forming a part of the illumination system and comprising:
   two substantially parallel reflective surfaces positioned such that an input beam of radiation is incident on a first of the reflective surfaces by which it is reflected towards a second of the reflective surfaces by which the radiation is reflected to produce an output beam of radiation of required intensity, wherein the reflective surfaces are positioned such that substantially all of the radiation from the input beam that is included in the output beam is reflected only a single time by each of the reflective surfaces, and an actuator to tilt the reflective surfaces such that the reflective surfaces remain substantially parallel to one another and an angle of incidence of the input beam on the first reflective surface and an angle of incidence of the reflected beam on the second reflective surface are changed so as to vary the intensity of the output beam while substantially maintaining a position of the output beam.

2. An apparatus as claimed in claim 1, wherein the reflective surfaces are positioned relative to the input beam such that the radiation is incident on the reflective surfaces at angles of between approximately 20 and 60 degrees.

3. An apparatus as claimed in claim 1, wherein the reflective surfaces are positioned relative to the input beam such that the radiation is incident on the reflective surfaces at angles of grazing incidence up to 30 degrees.

4. An apparatus as claimed in claim 1, wherein the reflective surfaces are positioned relative to the input beam such that the radiation is focussed at a point between the reflective surfaces.

5. An apparatus as claimed in claim 1, wherein the reflective surfaces are positioned relative to the input beam such that the radiation is focussed at a point beyond the second reflective surface.

6. An apparatus as claimed in claim 1, wherein the reflective surfaces are positioned relative to the input beam such that the radiation is focussed at a point before the first reflective surface.

7. An apparatus as claimed in claim 1, wherein the reflective surfaces comprise single layer coatings for enhancing their reflectivity.

8. An apparatus as claimed in claim 1, wherein the reflective surfaces comprise multi-layer coatings for enhancing their reflectivity.

9. An apparatus as claimed in claim 1, wherein the reflective surfaces comprise randomised multi layer coatings comprising a stack of bilayers with the thickness of the bilayers varying randomly over the thickness of the stack.

10. An apparatus as claimed in claim 1, wherein the actuator is arranged to shift the reflective surfaces in opposite senses while the reflective surfaces are tilted so as to maintain the output beam in substantially the same position for different attenuation settings.

11. An apparatus as claimed in claim 1, wherein the radiation has a wavelength of between about 5 nm and about 20 nm.

12. An apparatus as claimed in claim 1, wherein the illumination system is arranged to receive radiation from a source of radiation, and wherein a position of the source is shiftable as the reflective surfaces are tilted so as to maintain virtual focus point at which the radiation is focussed in substantially the same position for different attenuation settings.

13. A device manufacturing method comprising:
varying an intensity of a projection beam of radiation to be patterned and projected onto a substrate having a radiation sensitive surface by:
positioning two substantially parallel reflective surfaces such that an input beam of radiation is incident on a first of the reflective surfaces by which it is reflected towards a second of the reflective surfaces by which the radiation is reflected to produce an output beam of radiation of required intensity, wherein the reflective surfaces are positioned such that substantially all of the radiation from the input beam that is included in the output beam is reflected only a single time by each of the reflective surfaces, and tilting the reflective surfaces such that the reflective surfaces remain substantially parallel to one another and the angles of incidence of the radiation on the reflective surfaces are changed so as to vary the intensity of the output beam while substantially maintaining a position of the output beam.

14. A method as claimed in claim 13, wherein the reflective surfaces are positioned relative to the input beam such that the radiation is incident on the reflective surfaces at angles of approximately 20 and 60 degrees.

15. A method as claimed in claim 13, wherein the reflective surfaces are positioned relative to the input beam such that the radiation is incident on the reflective surfaces at angles of grazing incidence up to 30 degrees.

16. A method as claimed in claim 13, wherein the reflective surfaces are positioned relative to the input beam such that the radiation is focussed at a point between the reflective surfaces.

17. A method as claimed in claim 13, wherein the reflective surfaces are positioned relative to the input beam such that the radiation is focussed at a point beyond the second reflective surface.

18. A method as claimed in claim 13, wherein the reflective surfaces are positioned relative to the input beam such that the radiation is focussed at a point before the first reflective surface.

19. A method as claimed in claim 13, wherein the reflective surfaces are shifted in opposite senses at the same time as the reflective surfaces are tilted so as to maintain the output beam in substantially the same position for different attenuation settings.

20. A method as claimed in claim 13, wherein the radiation has a wavelength between about 5 nm and about 20 nm.

21. A method as claimed in claim 13, further comprising:
receiving radiation from a source of radiation;
shifting a position of the source as the reflective surfaces are tilted so as to maintain a virtual focus point at which the radiation is focussed in substantially the same position for different attenuation settings.

22. A variable attenuator comprising:
two substantially parallel reflective surfaces positioned such that an input beam of radiation is incident on a first of the reflective surfaces by which it is reflected towards a second of the reflective surfaces by which the radiation is reflected to produce an output beam of radiation of required intensity, wherein the reflective surfaces are positioned such that substantially all of the radiation from the input beam that is included in the output beam is reflected only a single time by each of the reflective surfaces, and an actuator to tilt the reflective surfaces such that the reflective surfaces remain substantially parallel to one another and an angle of incidence of the input beam on the first reflective surface and an angle of incidence of the reflected beam on the second reflective surface are changed so as to vary the intensity of the output beam while substantially maintaining a position of the output beam.

* * * * *